United States Patent
Leyten et al.

(10) Patent No.: US 7,315,206 B2
(45) Date of Patent: Jan. 1, 2008

(54) TRAVELLING-WAVE AMPLIFIER

(75) Inventors: Lukas Leyten, Eindhoven (NL); Jozef Reinerus Maria Bergervoet, Eindhoven (NL)

(73) Assignee: NXP B.V., Eindhoven (NL)

( * ) Notice: Subject to any disclaimer, the term of this patent is extended or adjusted under 35 U.S.C. 154(b) by 260 days.

(21) Appl. No.: 10/535,056

(22) PCT Filed: Oct. 28, 2003

(86) PCT No.: PCT/IB03/04831

§ 371 (c)(1),
(2), (4) Date: May 13, 2005

(87) PCT Pub. No.: WO2004/047288

PCT Pub. Date: Jun. 3, 2004

(65) Prior Publication Data
US 2006/0055464 A1    Mar. 16, 2006

(30) Foreign Application Priority Data
Nov. 19, 2002    (EP) .................................. 02079808

(51) Int. Cl.
*H03F 3/60*    (2006.01)

(52) U.S. Cl. .............................. 330/54; 330/53; 330/43

(58) Field of Classification Search .................. 330/43, 330/53, 54
See application file for complete search history.

(56) References Cited

U.S. PATENT DOCUMENTS

| 5,027,084 | A | * | 6/1991 | Tsukii ........................ 330/295 |
| 5,361,038 | A | * | 11/1994 | Allen et al. .................... 330/54 |
| 5,550,513 | A | | 8/1996 | Wong |
| 5,821,813 | A | * | 10/1998 | Batchelor et al. ........... 330/277 |
| 6,392,790 | B1 | * | 5/2002 | Lauder et al. ........... 359/341.2 |
| 6,759,907 | B2 | * | 7/2004 | Orr et al. ..................... 330/286 |
| 6,798,281 | B2 | * | 9/2004 | Dueme et al. ................. 330/51 |

FOREIGN PATENT DOCUMENTS

| EP | 0430509 A2 | 6/1991 |
| EP | 0430509 A3 | 6/1991 |

* cited by examiner

*Primary Examiner*—Patricia Nguyen

(57) ABSTRACT

A traveling-wave amplifier includes amplifiers coupled anti-parallel to transmission lines. Phase(s) of the amplifiers provide phase matching, which may additionally or alternately be provided by couplers or spatial offset of the amplifiers and couplers. The traveling-wave amplifier provides compensation for the losses of the transmission lines, amplification of the signals and isolation between input and output by coupling the amplifiers to the transmission lines anti-parallel.

11 Claims, 2 Drawing Sheets

TRAVELLING-WAVE AMPLIFIER

Figure 1:
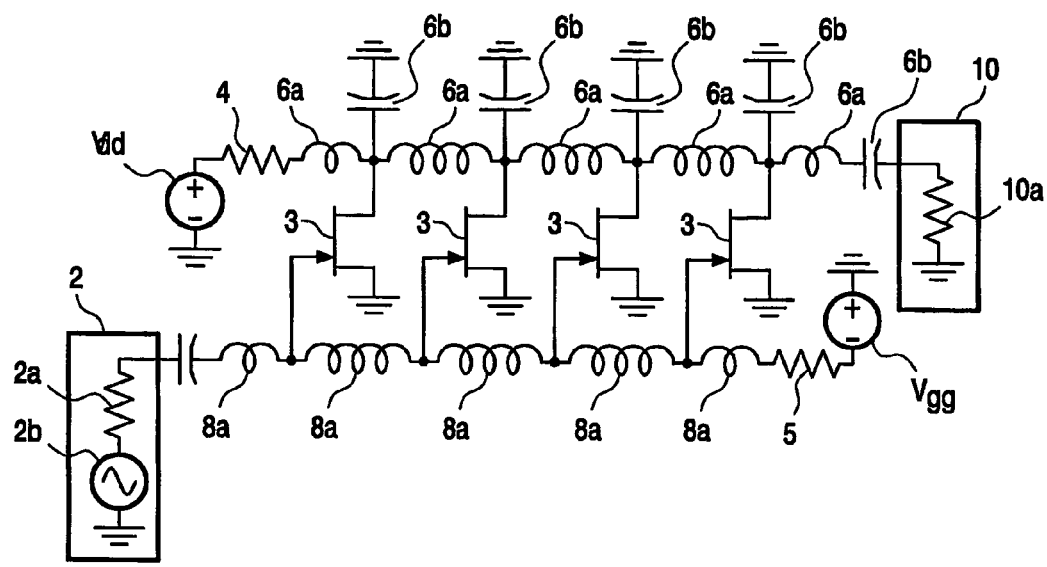

The invention relates to a travelling-wave amplifier comprising two transmission lines, and at least two amplifiers. The invention further relates to a method for providing travelling-wave amplification and the use of such a travelling-wave amplifier or method.

U.S. Pat. No. 5,550,513 describes a fully differential amplifier. The amplifier comprises a plurality of interconnected distributed amplifier stages, each having input means to receive a high frequency input signal. A pair of transmission lines for transferring the high frequency input signal to each of the distributed amplifier stages, is provided. The circuit also comprises a pair of output transmission lines connected to each of the distributed amplifier stages to deliver the summed, differential output to appropriate output terminals. Further biasing means are provided to supply a dc-current to the distributed amplifier stages for controlling the amplitude of the high frequency differential output. This differential amplifier comprises unbalanced transmission lines, which have a ground plane in which the return current flows.

It is therefore an object of the invention to provide an improved travelling-wave amplifier.

The object of the invention is achieved by a travelling-wave amplifier, where said amplifiers are coupled anti-parallel to said transmission lines. Thereby the travelling-wave of a first transmission line is fed to a first amplifier, said first amplifier amplifies this input signal and adds this amplified signal to the travelling-wave of said second transmission line. The travelling-wave of said second transmission line is fed to an input port of a second amplifier, said second amplifier also amplifies this signal and adds the amplified signal to the travelling-wave of said first transmission line. It is preferred that any two consecutive amplifiers are coupled anti-parallel to the transmission lines. The amplified signals are added to the signals on the transmission lines and with each amplifier the travelling-wave is amplified.

By providing such a travelling-wave amplifier, the signals are amplified, the losses on the transmission lines are compensated for, the common mode currents are reduced, input and output signals are isolated, and reflected waves may be suppressed.

In an embodiment, providing said coupling means, the amplifiers may be coupled electrically to the transmission lines. It is preferred that said coupling means are electrical connections or directional coupling circuits. The directional coupling circuits may add directivity and isolation to the travelling-wave amplifier.

In another embodiment, a coupling allows for easy coupling between the amplifiers and the transmission lines. As a spatial offset is allowed, design restrictions may be overcome.

In yet another embodiment, the travelling-wave at the two transmission lines may have a phase difference of 180°. When coupling the output signal of an amplifier to the travelling-wave on a transmission line, the phase of the signals should be matched such that the amplified signal adds to the travelling-wave.

A further embodiment of the travelling-wave amplifier allows for de-coupling the amplifier with further circuits.

A method for providing travelling-wave amplification, in particular with a pre-described travelling-wave amplifier, with two transmission lines and at least two amplifiers, where said travelling-waves at said transmission lines have a phase difference of 180°, where the output of a pair of said amplifiers is fed to said transmission lines anti-parallel such that the travelling-wave of a first transmission line is fed to a first amplifier, said first amplifier adds an amplified signal to the travelling-wave of said second transmission line and the travelling-wave of said second transmission line is fed to a second amplifier, said second amplifier adds an amplified signal to the travelling-wave of said first transmission line, is a further aspect of the invention.

Yet a further aspect of the invention is the use of travelling-wave amplifiers in optical systems, optical switch matrices, optical communication systems, RF wideband products, microwave communication, set-top boxes for satellite TV or satellite communication, anti-collision radar, wireless local loops, advanced IC processors such as GaAs and InP processes.

Figure 2:
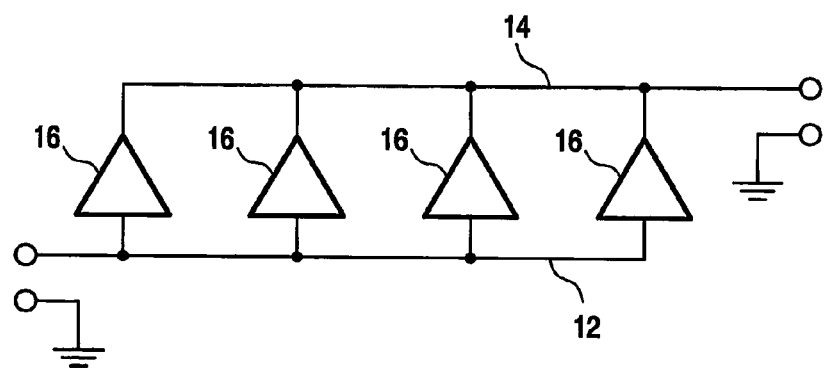
Figure 3:
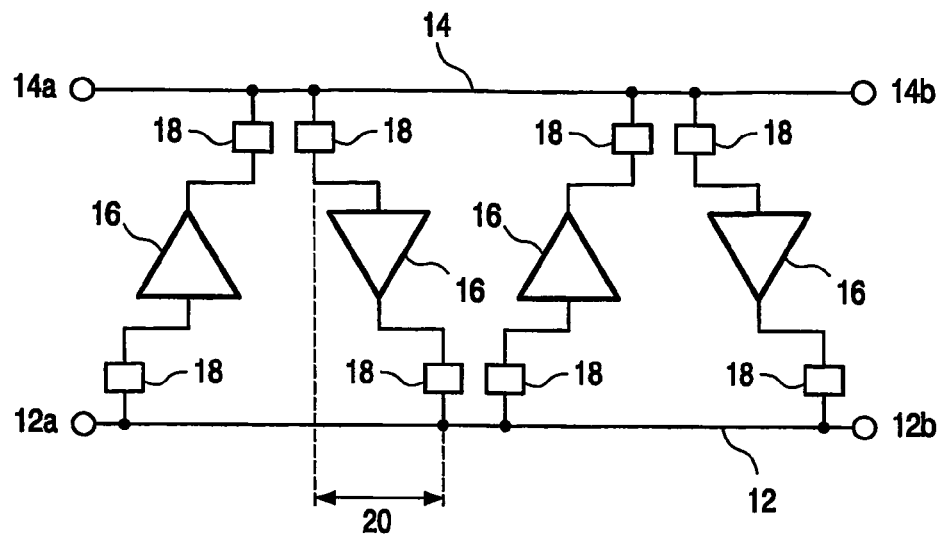
Figure 4:
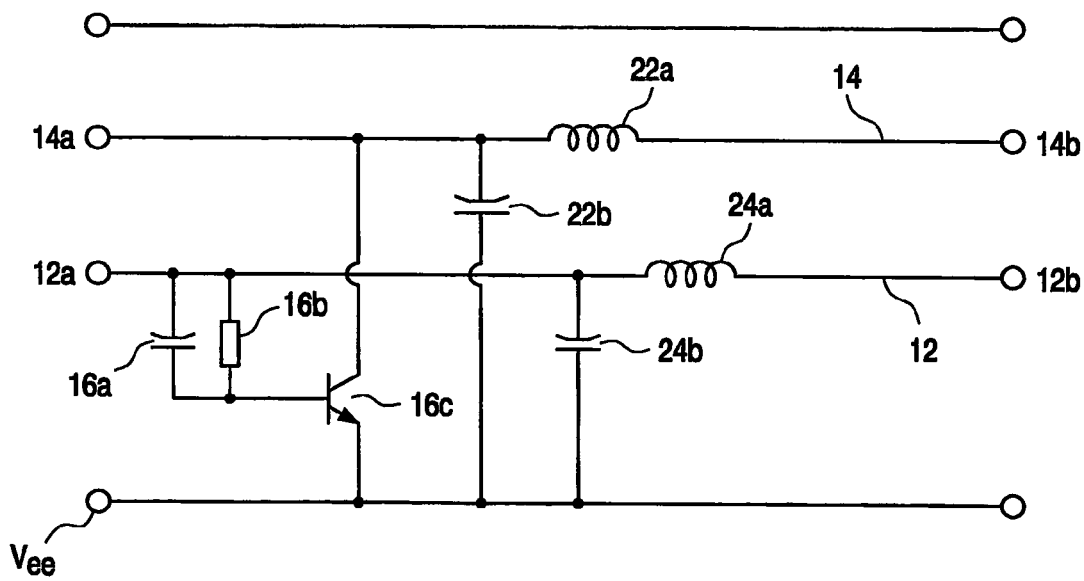

These and other aspects of the invention will be apparent from and elucidated with reference to the following figures in which:

FIG. 1 depicts a distributed travelling-wave amplifier according to the invention, FIG. 2 depicts a block diagram of a standard travelling-wave amplifier according to the invention, FIG. 3 a travelling-wave amplifier according to the invention; and FIG. 4 a node of a travelling-wave amplifier according to the invention.

FIG. 1 depicts a common travelling-wave amplifier (TWA). This TWA is based on using the parasitics of a transistor as an integral part of the transmission line. By connecting several transistors 3 with suitable interconnection lines between them, a distributed or synthetic transmission line is formed. This transmission line exhibits signal gain instead of signal loss.

A synthetic transmission line is formed in the gate circuit of the transistors 3 from the inductors 8a and the input impedances of the transistors 3. A synthetic drain transmission line is formed from the inductors 6a and the capacitors 6b. The inductors 6a and capacitors 6b are formed by parasitics of the transmission lines. The transmission lines are terminated by their characteristic impedances 4 and 5.

An input signal is fed to the transistors from generator 2, comprising a signal generator 2b and a generator impedance 2a. For each transistor 3, the input signal propagates as a wave through a fraction of the gate line of the transistor 3 before driving the input of that transistor 3 and producing a drain current. The drain current generates a forward wave on the drain line, which propagates to the output 10 with output load 10a.

The bandwidth of such a TWA is limited because of delay mismatches between the two synthetic lines. The gain-bandwidth product is constrained by the transistor power-gain cut-off frequency.

Depicted in FIG. 2 is a block diagram of the TWA shown in FIG. 1. The transmission lines 12, 14 are connected to the amplifiers 16, which may comprise capacitors 6b, transistors 3 and inductors 6a and 8a.

FIG. 3 depicts a block diagram of a TWA according to the invention. Depicted are transmission lines 12, 14. These transmission lines 12, 14 have inputs 12a, 14a and outputs 12b, 14b. These transmission lines 12, 14 are connected by amplifiers 16. These amplifiers are coupled anti-parallel to the transmission lines. The output of a first amplifier 16 is coupled to transmission line 14. The output of the next amplifier 16 is coupled to transmission line 12. That means that any two consecutive amplifiers 16 are coupled to the transmission lines 12, 14 with different directivities. The inputs of the amplifiers 16 are not necessarily positioned spatially at the same place as the outputs, but may have spatial offsets 20. The inputs and outputs of the amplifiers 16 are coupled to the transmission lines 12, 14 with coupling arrangements 18, which may be simple electrical connections or directional coupling circuits, providing directivity and isolation to the TWA circuit. The travelling-waves at the transmission lines 12, 14 have phase differences of 180°. The amplified signals at the output of each amplifier 16 should be such that the signals add to the respective travelling-wave on the transmission line. The phase match is achieved by varying the offset 20, the phase of the amplifiers 16 and/or the phase of the coupling arrangements 18.

FIG. 4 depicts one amplifier 16 coupled to transmission lines 12, 14. The amplifier comprises capacitor 16*a*, impedance 16*b*, and transistor 16*c*. Transmission lines 12 and 14 are coupled to $V_{ee}$ by capacitors 22*b*, 24*b* and inductors 22*a*, 24*a*. The transistor 16*c* receives its DC-bias from the transmission lines. With sixteen consecutive amplifiers 16 the TWA may have a gain of 11 dB with the −3 dB point at 4,6 GHz, resulting in a gain-bandwidth product of 16,5 GHz. It is an intention of the invention to use frequencies up to 100 GHz or more. Especially in optical networks, the bandwidth of the signal processing has to be large, e.g. a bandwidth of 10 GHz is common In optical networks differential transmission lines are often used, as lasers and photo diodes have differential connections. In optical switch matrices a differential transmission line may be up to 2 mm long. They have to be implemented on semiconductor substrates and be able to connect many inputs and outputs, which may be achieved with a TWA according to the invention. The inventive TWA may compensate for imperfections and signal loss at the nodes of an optical switching matrix.

The invention claimed is:

1. A traveling-wave amplifier comprising transmission lines, and at least two amplifiers, said at least two amplifiers being coupled anti-parallel to said transmission lines, wherein a phase of said at least two amplifiers provides phase matching.

2. The traveling-wave amplifier according to claim 1, further comprising coupling means for coupling said at least two amplifiers to said transmission lines, respectively.

3. The traveling-wave amplifier according to claim 1, wherein coupling of an input port of one amplifier of said at least two amplifiers to one of said transmission lines is spatial by set off from a coupling of an output port of said one amplifier to the other of said at least two transmission lines.

4. The traveling-wave amplifier according to claim 2, wherein said coupling means are electrical connections.

5. The traveling-wave amplifier according to claim 2, wherein said coupling means are directional coupling circuits.

6. The traveling-wave amplifier according to claim 1, wherein the phase of the output signal of said amplifiers is matched with the phase of the traveling-wave on the respective transmission line.

7. A traveling-wave amplifier comprising transmission lines, and at least two amplifiers, said at least two amplifiers being coupled anti-parallel to said transmission lines, wherein coupling of an input port of one amplifier of said at least two amplifiers to one of said transmission lines has a spatial offset from a coupling of an output port of said one amplifier to the other of said at least two transmission lines, and wherein said spatial offset provides said phase matching.

8. A traveling-wave amplifier comprising transmission lines, at least two amplifiers, and coupling means for coupling said at least two amplifiers to said transmission lines, respectively, said at least two amplifiers being coupled anti-parallel to said transmission lines, wherein said coupling means provide phase matching.

9. The traveling-wave amplifier according to claim 1, wherein said amplifiers retrieve DC-bias voltage from said transmission lines.

10. A method for providing traveling-wave amplification, with a traveling-wave amplifier having transmission lines and amplifiers, wherein traveling-wave at said transmission lines have a phase difference of 180°, the method comprising the acts of:

feeding an output of a pair of said amplifiers to said transmission lines anti-parallel such that the traveling-wave of a first transmission line is fed to a first amplifier, adding by said first amplifier an amplified signal to the traveling-wave of said second transmission line, feeding the traveling-wave of said second transmission line to a second amplifier, and adding by said second amplifier an amplified signal to the traveling-wave of said first transmission line.

11. Use of the traveling-wave amplifier according to claim 1, in optical switch matrices; optical communication systems, RF wideband products, microwave communication, set-top boxes for satellite TV or satellite communication, anti-collision radar, wireless local loops, advanced IC processors such as GaAs and InP processes.

* * * * *